United States Patent [19]
Taylor

[11] Patent Number: 6,031,243
[45] Date of Patent: Feb. 29, 2000

[54] GRATING COUPLED VERTICAL CAVITY OPTOELECTRONIC DEVICES

[75] Inventor: Geoff W. Taylor, 96 Quail Run, Glastonbury, Conn. 06033

[73] Assignee: Geoff W. Taylor, Glastonbury, Conn.

[21] Appl. No.: 08/949,502

[22] Filed: Oct. 14, 1997

Related U.S. Application Data

[60] Provisional application No. 60/028,577, Oct. 16, 1996.

[51] Int. Cl.[7] .......................... H01L 29/06; H01L 33/00; H01S 3/19
[52] U.S. Cl. .............................. 257/13; 257/96; 257/98; 257/194; 372/46; 372/50
[58] Field of Search ................................. 257/14, 94, 96, 257/98, 13, 192, 194; 372/44, 45, 46, 50

[56] References Cited

U.S. PATENT DOCUMENTS

| | | | |
|---|---|---|---|
| 4,658,403 | 4/1987 | Takiguguchi et al. | 372/96 |
| 5,202,896 | 4/1993 | Taylor | 372/50 |
| 5,337,328 | 8/1994 | Lang et al. | 372/45 |

OTHER PUBLICATIONS

Analysis of grating–coupled radiation in GaAs:GaAlAs lasers and waveguides, W. Streifer, D.R. Scifres and R.Burnham, IEEE Journal of Quantum Electronics, vol. 12, No. 7, pp. 422–428, Jul. 1976.

Second–Order distributed feedback lasers with mode selection provided by first–order radiation losses, R.F.Kazarinov and C.H.Henry, IEEE Jornal of Quantum Electronics, vol. 21, No. 2, pp. 144–150, May 1985.

Watt–range coherent, uniphase powers from phase–locked arrays of antiguided diode lasers, D.Botez, M.Jansem, L.J.Mawst, G.Peterson, and T.J.Roth, IEEE Journal of Quantum Electronics, vol. 58, No. 19, pp. 2070–2072, May 1991.

Normal–incidence grating couplers in Ge–Si, J.Sarathy, R.A.Mayer, K.Jung, S.Unnikrishnan, D.–L.Kwong, and J.C.Campbell, Optics Letters, vol. 19, No. 11, pp. 798–800, Feb. 1994.

*Primary Examiner*—Minh Loan Tran

[57] ABSTRACT

A edge emitting waveguide laser is obtained that derives its optical power from a vertical cavity laser structure. The vertical cavity laser with top and bottom Distributed Bragg Reflectors produces stimulated emission by resonance in the vertical direction but the optical power so generated is diffracted by a second order grating into an optical mode propagating in the optical waveguide formed by the upper and lower mirrors as cladding layers. The efficiency of the diffraction grating and the reflectivity of the mirrors are maximized so that essentially all of the light is coupled into the guide and the loss through the mirrors can be neglected. The same structure can be utilized as a detector, a modulator or an amplifier. The designated laser structure to achieve this form of operation is the inversion channel laser which is a laterally injected laser having both contacts on the top side of the device. Then the anode and cathode of the laser are essentially coplanar electrodes and the device is implemented in the form of a traveling wave laser, detector, modulator or amplifier which forms the basis for very high frequency performance.

8 Claims, 9 Drawing Sheets

FIG.1

| Layer | Description |
|---|---|
| 168 | P+ GaAs |
| 167 | P+ Al$_x$Ga$_{1-x}$As (x>.4) |
| 166 | NID Al$_x$Ga$_{1-x}$As (x~.15) |
| 165 | NID GaAs |
| 164 | NID InGaAs |
| 163 | NID GaAs |
| 162 | NIDAl$_x$Ga$_{1-x}$As (x~.15) |
| 161 | N+ Al$_x$Ga$_{1-x}$As (x>.4) |
| 160 | N+ GaAs |

Layers 165, 164, 163 ×3

Laser

Detector

Current flow diagram for laser and detector

Fig. 8

GRATING COUPLED VERTICAL CAVITY OPTOELECTRONIC DEVICES

CROSS REFERENCE TO RELATED APPLICATIONS

This application is a continuation of application Ser. No. 60/028,577, filed Oct. 16, 1996, abandoned.

TECHNICAL FIELD OF INVENTION

This invention relates to the field of semiconductor double heterostructure laser devices and, in particular, to those laser devices which use vertical cavities. It also relates to the field of corrugated optical waveguides and travelling wave optoelectronic devices.

BACKGROUND OF INVENTION

Next generation transmission systems are anticipating bit rates approaching 100 Gb/s in time division multiplexed architectures. The demand for such speeds is created by the growth of interactive multi-media services and is made possible by the terahertz bandwidth of optical fiber. Realizing optical sources with these modulation bandwidths remains a significant obstacle however. The state-of-the-art edge-emitting semiconductor lasers have 3 db bandwidths in the region of 30 GHz. The limitations on this bandwidth arise from the non-linear gain mechanism and from the maximum values of differential gain that can be realized. The non-linear gain effect is due to the presence of current transport in the SCH(separate confinement heterostructure) regions and the associated dynamic response. The SCH regions perform the functions of both carrier confinement and optical confinement. For the purposes of carrier confinement, these regions can be reduced substantially. However, in the edge emitter these regions cannot be reduced to much less than about 1500Å in thickness and yet still maintain a reasonable value for $\Gamma$, the optical confinement factor for the quantum well in the optical waveguide. Also, as the low index waveguide regions are placed closer to the quantum well, the large index difference interfaces produce larger waveguide loss.

The differential gain is established by the differential stimulated lifetime which is essentially equal to (or slightly less) than the photon lifetime given by $$\tau_p^{-1} = v_g \left( \frac{1}{L} \ln\left(\frac{1}{R}\right) + \alpha \right)$$

where the parameters are R, the reflectivity of the cleaved facets and L, the length of the laser. The laser bandwidth varies inversely with $\tau_p$. To increase speed either L or R must be reduced. With the semiconductor to air reflectivity fixed at about 0.3, the laser length cannot be reduced below about 200 $\mu$m (by cleaving or by using dry etched mirrors). This limit is imposed by the rapidly rising threshold current and the reduced power capability. The output power is limited by the total device volume which is being reduced with the length. This tradeoff between speed and power with reduced length (constant power×bandwidth product) is common to all devices.

The vertical cavity laser has emerged as an alternative to the edge emitting laser because it allows a different mode of operation. In this case the mirror reflectivity is increased very close to unity and the cavity length is reduced to 1–3 wavelengths. Therefore the mirror loss term in the photon lifetime, i.e. ln(1/R)/L may be designed to be essentially the same as in the edge emitter. The term $\alpha$ representing optical loss is no longer limited by waveguide loss as in the edge emitter but rather by scattering in the mirrors and at the edges of the vertical cavity. Therefore the widths of the SCH layers in the vertical cavity growth are no longer important for determining $\alpha$ and can be reduced for the purposes of reducing the non-linear gain effect and therefore of increasing the bandwidth. Also, reducing the thicknesses of the SCH layers does not compromise $\Gamma$ the optical confinement factor as it does in the edge emitter, since $\Gamma$ is now determined only by the volume ratio of active layer to cavity size and position of active layer with respect to the standing wave and not by the waveguide parameters. Therefore the vertical cavity device can be optimized to reduce the "non-linear gain" effect and the mirror can be flexibly designed to trade-off the number of reflector pairs for a lower $\tau_p$. Lower $\tau_p$ implies lower differential stimulated lifetime ($\tau_{st}^*$) and therefore larger bandwidth due to the increase in differential gain at the expense of a larger threshold current. The larger threshold, of course, results in lower maximum power due to the reduced current range for optical output and the increase in internal device heating.

In spite of the potential for high speed offered by the vertical cavity devices, the maximum reported bandwidths have been about 15 GHz. The limiting factor in these advanced structures has been the RC time constant of the device. In the edge-emitting laser, this bandwidth limitation results from the device parasitic capacitance (bond pad plus intrinsic PIN capacitance) and the output resistance of the measurement system because the device series resistance can be made very small. In the vertical cavity device, the device series resistance cannot be made negligibly small because the conduction is either forced through part of a DBR mirror or suffers from current crowding effects. Current crowding results because the current must flow two dimensionally from an adjacent region into the optically active area. The two dimensional flow is required since the current flow and optical emission are necessarily along the same axis.

Vertical cavity devices also have an output which is randomly polarized. It would be very useful to have a means to predetermine and maintain the polarization. Another impediment to vertical cavity deployment is the coupling of the light to fibers. Current methods use polymer waveguides or mirrors to redirect the light from the vertical to the horizontal direction. This is not a cost effective approach.

Another requirement of a very high speed laser is integration with driving electronics. At speeds of 100 GHz, hybrid connections of lasers and transistors become costly and impractical. A cost effective solution requires integrated devices. Therefore solutions to achieve 100 GHz laser operation to be successful practically will be part of an integrated optoelectronic technology.

The limitations of the laser in terms of matching impedances between the optoelectronic device and the electronic interface are the same for a laser or for a detector. Therefore the solutions to eliminating undesirable reflections for the laser may also be used for a detector It is an object of this invention to provide vertical cavity operation of a laser which is implemented with the geometry of an edge emitter and so is capable of output powers proportional to the total volume of the laser cavity which can be very large, without sacrificing bandwidth.

It is an object of this invention to provide a vertical cavity laser in which the speed is not limited by the input impedance of the laser. Therefore, the goal of the invention is to introduce a traveling wave concept for both a laser and a detector which can eliminate the reflections produced at mismatched interfaces.

It is an object of this invention to provide a very high brightness source by concentrating all the power from a large volume optical cavity through a small output cross-sectional area.

It is an object of this invention to produce a predictable and stable polarization for the output of a vertical cavity laser.

It is an object of this invention to eliminate the effect of back reflections from fiber or waveguide interfaces upon the stability of the laser output. This is the function of an optical isolator.

It is an object of this invention to optimize and facilitate the coupling from a vertical cavity laser to a fiber by converting the vertical cavity power to waveguide power where the waveguide construction and parameters provide for a large misalignment tolerance.

It is a final object of this invention to provide the edge emitting output of a vertical cavity laser in the format of a optoelectronic integrated circuit so that the functionality of electronic and optoelectronic devices is merged.

SUMMARY OF THE INVENTION

A semiconductor laser or detector has been invented which is a vertical cavity device constructed with a dual dielectric top Distributed Bragg Reflector (DBR) mirror wherein a diffraction grating in the second order is incorporated into the dielectric layer which is the first layer to be deposited upon the vertical cavity. The function of the grating is to change the direction of propagation of the light from vertical to horizontal so that the output of the vertical resonant cavity is a mode in a waveguide. In general, as a laser it is desired to launch optical power primarily in one direction so that an asymmetry or blaze angle will be incorporated into the grating. Therefore the principle of operation is based on the diffraction of light produced by the vertical cavity laser into an optical mode which propagates in the guide. The polarization of the light is dictated by the polarization in the guide which itself is TE in general because of the higher diffraction efficiency for TE light. The light propagating in the guide also diffracts into the vertical cavity and reinforces the polarization of the vertical cavity emission through the process of stimulated emission. The device is designed so that the vertical emission is essentially inhibited and the device output is totally diffracted waveguide output and therefore the power output can be increased by simply extending the laser in length within the constraint of chip size. The grating structure may be applied to realize modulators, detectors and amplifiers in addition to lasers.

The device is described in one illustrative embodiment of the HFET inversion channel laser, which comprises one of the laser devices in the general family of inversion channel optoelectronic devices which are modulation doped devices. In this form of the invention, a refractory metal emitter provides a conduction path of hole flow into the laser active region by two-dimensional conduction. The two dimensional contour of the conduction path is established by an N type implant under the metal emitter. The refractory metal emitter is constituted of two metal stripes one positioned on either side of an optical waveguide which utilizes the upper DBR mirror of the vertical cavity to provide its cladding. Separation of the refractory metal contact into two stripes enables a waveguide to transport the light diffracted into the channel from the vertical cavity laser mechanism by the action of the grating without losses from optical scattering at the metal. The device is a laterally injected laser and thus ion-implanted source contacts provide electron flow to the active laser channel, i.e. the inversion channel. The source contact metals stripes and the emitter metal strips form the electrodes for a coplanar transmission line. The device is designed for equal electrical and optical velocities.

It will be understood that while an important application of the grating coupling is in the laser device, the structure can also be employed in other optoelectronic devices such as modulators, detectors and amplifiers. For example by the reversal of the electrode potentials, the performance of a grating coupled detector is obtained.

BRIEF DESCRIPTION OF THE DRAWINGS

FIG. 1.5 is a schematic view of the layer structure of the pn laser which may be inserted between the mirrors of the grating coupled laser in FIG. 1.

DESCRIPTION OF THE PREFERRED EMBODIMENTS

Figure 1:
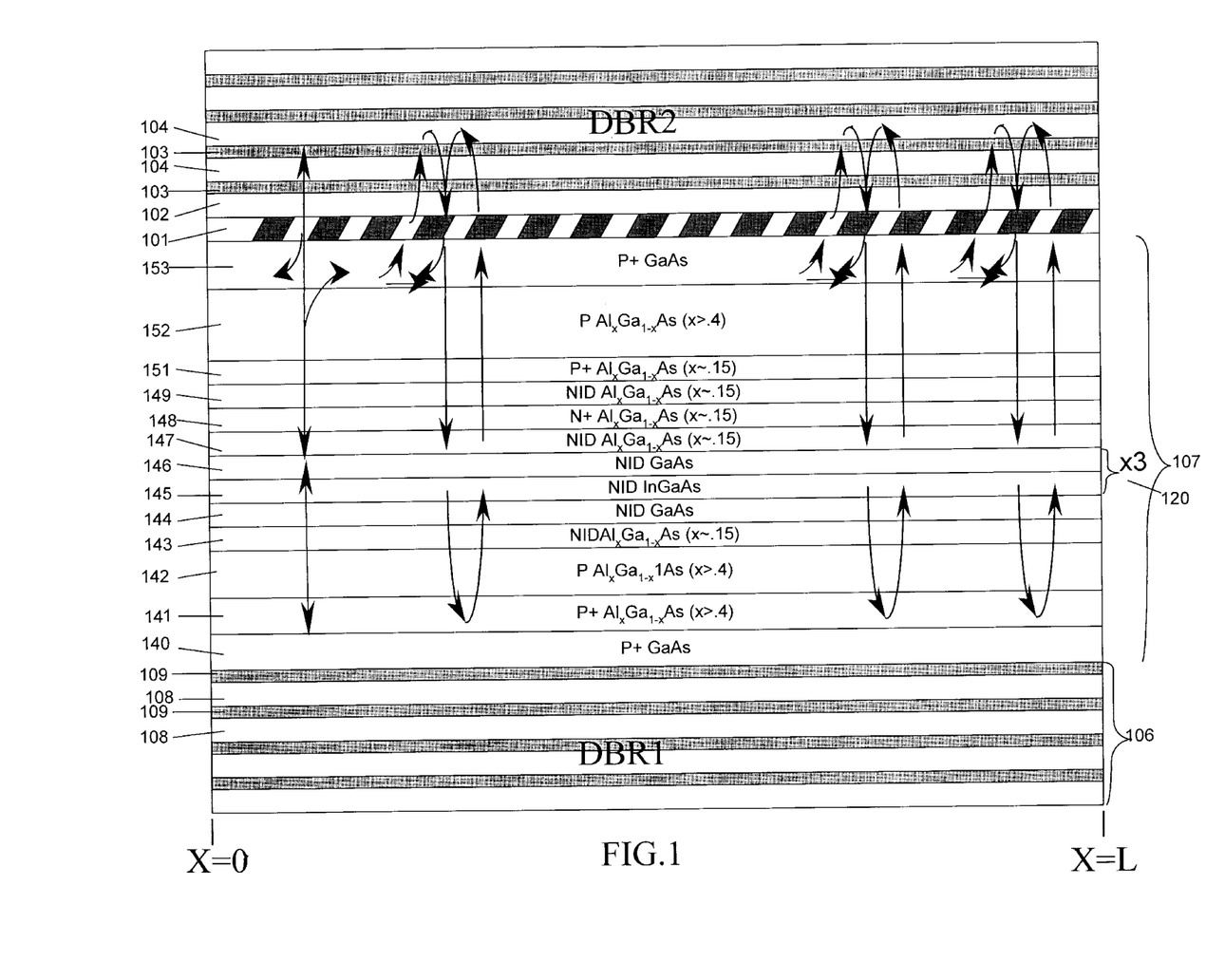
FIG. 1 is a schematic view through the center of the grating coupled laser waveguide and parallel to the direction of propagation of the optical mode in the waveguide. The grating is blazed in the direction of propagation which is from left to right. The vertical cavity oscillation is shown and also the growth of the waveguide mode.
Figure 2:
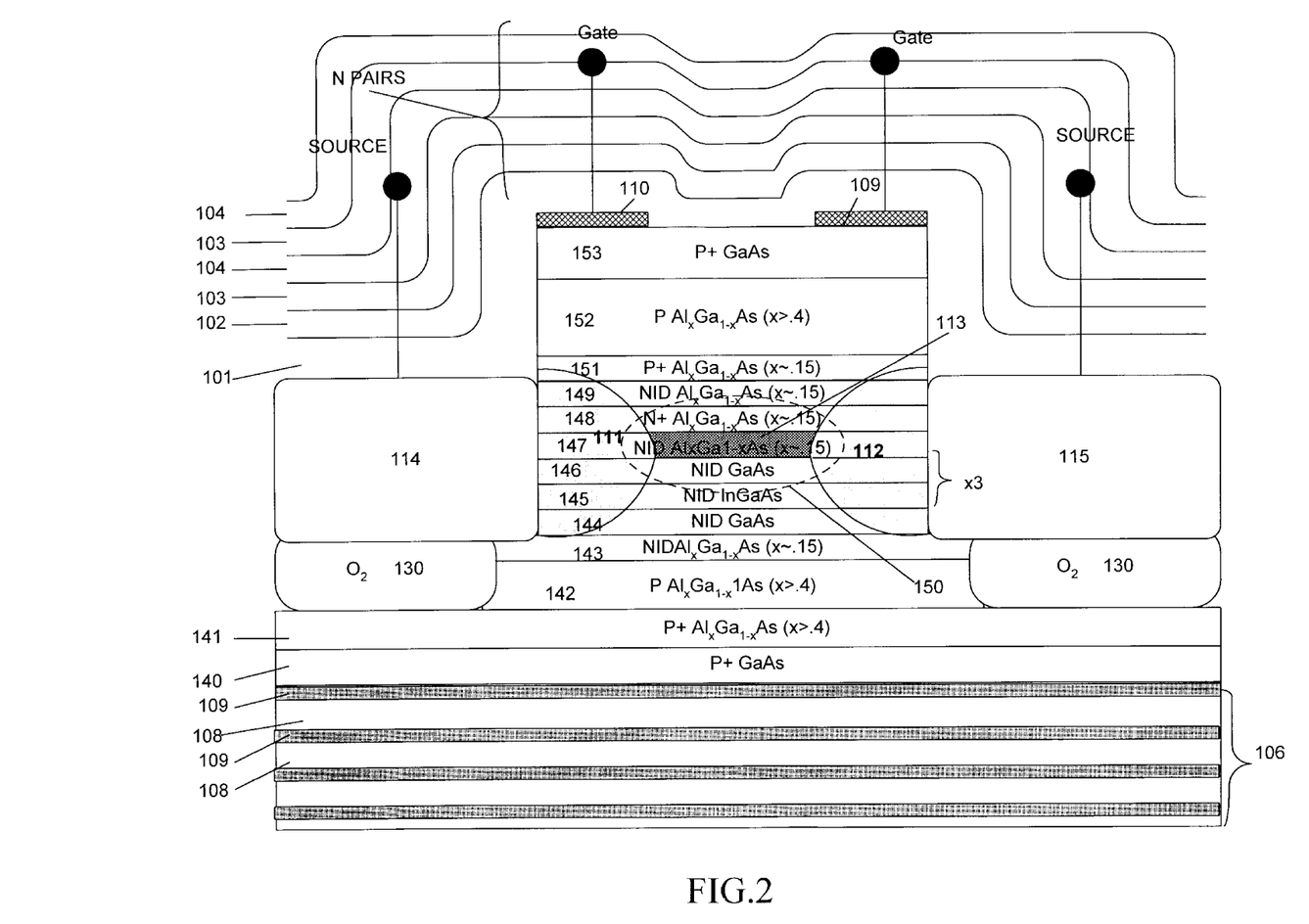
FIG. 2 is a cross-sectional view of the grating coupled laser implemented as the HFET Inversion Channel Laser at right angles to the waveguide. The optical mode 150 is confined by the N type implants 111 and 112 such that there is little loss by scattering from the metal emitter gate/emitter. The gate/emitters 110, 109 provides holes and the sources 114, 115 provides electrons.
Figure 3:
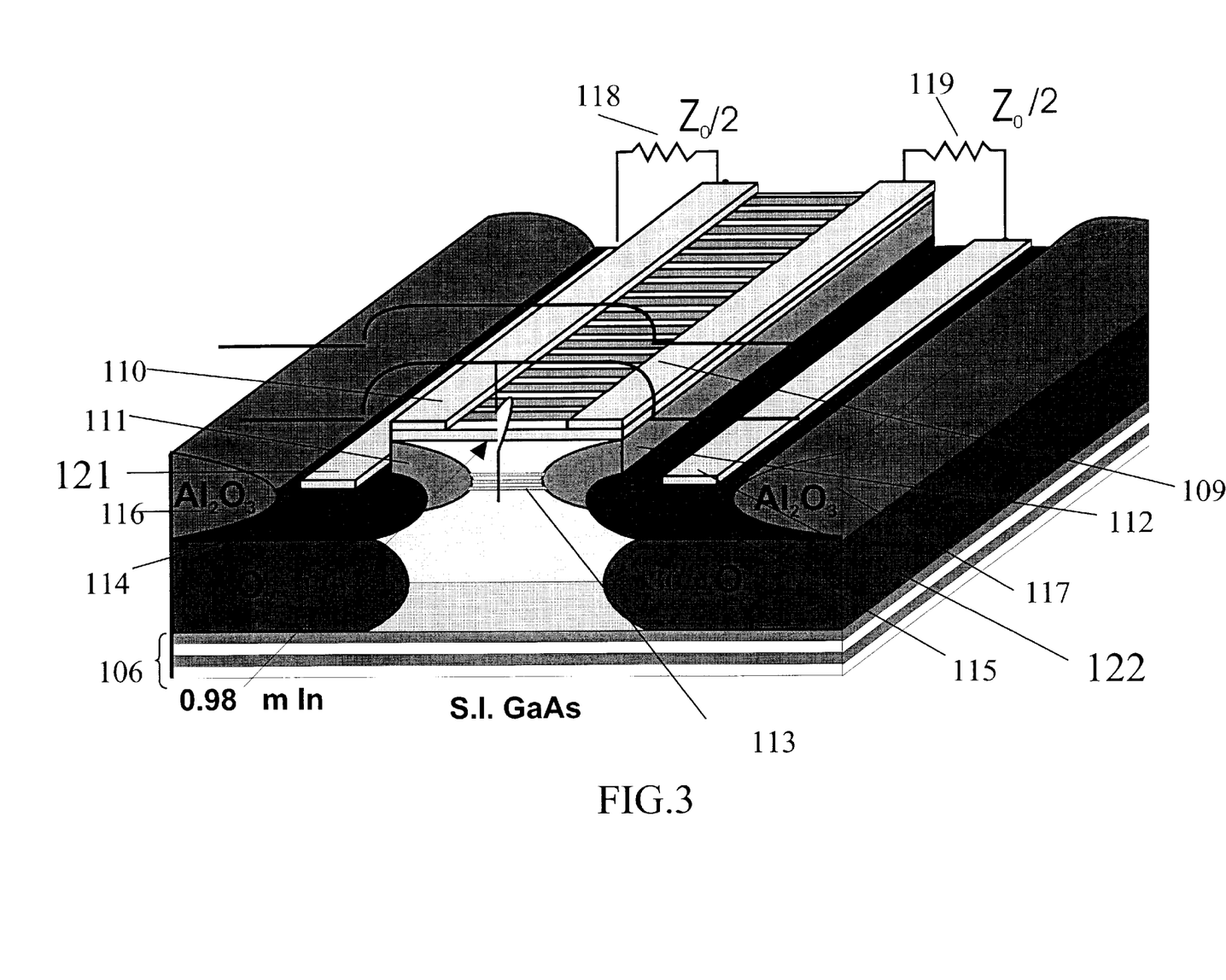
FIG. 3 is a schematic of the traveling wave three dimensional cross-section of the grating coupled HFET laser, detector, modulator or amplifier. The inversion channel technology is shown as the means of isolating the device and establishing contact to the source and gate electrodes. The source and gate electrodes establish a coplanar transmission line which is shown terminated in the characteristic impedance to obtain high speed.

FIGS. 1,2,3 shows the layers of a structure in accordance with a preferred embodiment and from which all the devices of the invention can be made. The semiconductor layer structure and fabrication are in accordance with the Inversion Channel Technology and have been described in detail in application Ser. No. 60/028,576. A vertical cavity laser is constructed comprised of: a lower DBR mirror 106 consisting typically of alternating layers 108 of GaAs and 109 of AlAs which itself will be oxidized during the fabrication to form layers 109 of $Al_xO_y$, a active laser cavity 107 consisting of the standard SCH (separate confinement heterostructure) semiconductor laser structure containing say 3 quantum wells 120 which may be the laser structure of the inversion channel laser as discussed here or the conventional pn laser structure, a top DBR mirror consisting of alternating layers 101, 102, 103, and 104 of two deposited dielectrics. For the inversion channel laser this structure consists of a layer 140 of P+ GaAs deposited on the lower DBR mirror, a layer 141 of P+ type AlGaAs (>40%) disposed on the P+ type GaAs layer; a layer 142 of P type AlGaAs disposed on the P+ type AlGaAs layer; a PHEMT (Pseudomorphic High Electron Mobility Transistor) disposed on the P type AlGaAs layer, the PHEMT consisting of the sequence of layers marked in FIG. 2 and comprising a not intentionally doped (NID) AlGaAs layer 143 (~15% Al), a NID GaAs spacer layer 144, one to three NID quantum wells 145 of strained InGaAs separated by NID GaAs barriers 146 and collectively labeled 120, a NID AlGaAs spacer layer 147 (~15% Al), an AlGaAs N+ type planar doped (very thin) layer 148 (~15% Al) which is typically referred to in the art as a modulation doped layer, and a NID AlGaAs gate capacitance layer 149 (~15% Al); a planar doped (very thin) P+ layer 150 of AlGaAs (~15% Al) disposed on the PHEMT structure; a P doped AlGaAs cladding or current blocking layer 151 disposed on the P+ planar doped layer; and a very thin layer 152 of about 100 Å of heavily doped P+ GaAs to enable the formation of an ohmic contact without significant absorption of an optical wave propagating through it. For the pn laser the structure consists of a layer 160 of N+ GaAs deposited on the lower DBR mirror, a layer 161 of N+ doped AlGaAs (>40%) cladding, a layer 162 of ND GaAs, a layer 163 of NID AlGaAs (confinement region) with ~15% Al, a series of ND InGaAs quantum wells 164 separated by ND GaAs barriers 165, a layer 166 of ND AlGaAs (confinement region) with ~15% Al, a layer 167 of P type doped AlGaAs (>40%) cladding and a very thin layer 168 of P+ type doped GaAs to serve as a top contact layer. In FIG. 1 the grating 101 is formed in the first layer of the mirror stack comprised of layers 101, 102, 103 and 104. It is a blazed grating which diffracts light preferentially in one direction as shown by the arrows indicating the direction of light propagation. The DBR mirror layers 102, 103 and 104 of the vertical cavity device are deposited on top of the cavity 105 and grating layer 101, and the bottom mirror 106 is formed under the cavity 107 during the growth. This device is designated the Grating Coupled Vertical Cavity Surface Emitting Laser (GC VCSEL). The device cross-section at right angles to the guide is shown in FIG. 2 and all the regions in FIG. 1 are identified here as well. However the blaze of the grating cannot be seen in this view. The laser is constructed in the form of a waveguide as shown in FIG. 3, wherein the refractory metal gate contacts which supply positive charge to the active region are separated into two stripes 109 and 110 and set back from the center of the guide to allow low loss propagation of the mode. The current is guided electrically into the active wells 113 by the N type implants 111 and 112. This guiding action describes the two dimensional current flow indicated by the large arrows in FIG. 2. These implants simultaneously provide the optical guiding function to maintain the optical mode in the center of the guide. The gate contacts become the masking feature which are used to define the ion implants 114 and 115, which are sources used to supply positive charge to region 113. N type gold alloy stripes are formed on implanted regions 114 and 115 to form a coplanar transmission line together with gates 110 and 109. The device is isolated potentially by oxygen implantation 130 beneath regions 114 and 115 and formed with the same mask and also by the formation of $Al_xO_y$ which penetrates from the side in regions 116 and 117 at the same time that the mirror layers 106 are formed beneath the device. The characteristic impedances $Z_o$ are of the transmission line are shown as terminations for high speed operation. For detector operation these are on the output of the device but for laser operation these are on the input to the device.

To understand the operation of the GC VCSEL consider the VCSEL operation at the back end of the device (x=0 in FIG. 1). The front end at x=L is the output port where light is to be emitted. The current is applied uniformly along the length of the device. When current is applied, light is generated vertically in the VCSEL at x=0. Consider the optical wave in the cavity as it passes through the grating. A small fraction is diffracted to the left. Due to the asymmetry of the blaze a much smaller fraction is diffracted to the right (this is illustrated by the relative sizes of the arrows in FIG. 1). Now if the grating were of zero thickness, then the remainder of the light, which is most of the energy, would pass through the grating, be reflected back and pass through the grating in the reverse direction. Due to the reversibility of the diffraction process, the majority of this light would be diffracted in the reverse direction with the net result that the light would be coupled fairly equally in both directions. However, the grating has a finite thickness and in addition the penetration of the light into the mirror is small for a high reflectivity mirror. Thus the intensity of the light traveling downward into the laser after reflection from the mirror decreases dramatically with penetration into the mirror. It follows then that the amplitude of the light incident on the grating from within the cavity is substantially greater than the amplitude of the light incident on the grating by reflection from the mirror. Therefore the fraction of light diffracted to the right is substantially less than the fraction of light diffracted to the left. The design criterion that is followed is that the thickness of the diffraction grating should be approximately equal to the penetration depth of the mirror (this is also determined by the standing wave effects in the grating which are found from the diffraction analysis). This situation is the one that will be implemented in practice because for a high reflectivity mirror, the decay of intensity to about 10% occurs within the first ¼ wavelength of the mirror stack and additionally, it is most practical to form the grating by etching through approximately the first layer of the mirror stack. In the fabrication sequence, the dielectrics chosen to form the mirrors are $SiO_2$ and undoped sputtered GaAs. This choice is dictated by the very large index difference which reduces the number of required pairs and the fact that our mirror must be deposited during the device processing. Given these layer components we have two choices to implement the grating 1)deposit a layer of GaAs and then pattern and etch this layer followed by a ¼ wave of $SiO_2$ and then GaAs etc. 2)deposit a ¼ wave layer of $SiO_2$, pattern and etch this layer and then deposit a ¼ wave of GaAs and then $SiO_2$ and then GaAs etc. The second of these is preferable. The choice of ¼ wave thickness is also supported by the grating efficiency and its dependence on the index difference between the layers of the stack as discussed below on grating efficiencies. In FIG. 1, the relative sizes of the arrows indicate that the majority of the light is diffracted to the right.

DETERMINATION OF DIFFRACTION EFFICIENCIES IN THE GRATING COUPLED VERTICAL CAVITY LASER

The quantitative prediction of diffracted power has been a subject of much study over the years primarily because of its importance to the operation of the DFB laser. In these cases the gratings are usually designed to be first order since it is the first order forward and backward traveling waves which form the basis of coupled mode theory. There are some instances where second order has been used in the DFB to produce an optical loss mechanism in an effort to stabilize the mode position as described by Kazarinov and Henry (however the laser output is still via the first order wave). More generally the second order grating has been used as the output reflector for DBR lasers in order to obtain vertical emission. Since the second order grating when implemented as a waveguide corrugation produces both first order diffraction in the guide and second order diffraction normal to the guide then it can be used in the DBR to provide both reflection for the guided wave and output coupling of the laser light.

All of the existing work on corrugated waveguides describes the diffraction in a general way which includes all possible diffraction orders with a separate equation for each order. The results are complicated, difficult to understand and require a full numerical analysis to obtain the quantitative predictions required for this work. For the GCVCSEL a simpler model is required. For the perfect second order case, the equations can be simplified and only one differential equation needs to be solved for a symmetrical grating. With this approach a simple predictor for diffraction efficiency results for both exact or approximate second order gratings (the approximate second order grating is one in which the grating pitch is either slightly smaller or larger than the exact value). The basis for the model is a three layer waveguide characterized by indices $n_1$, $n_2$, and $n_3$ in the regions above the guide, in the guide and below the guide. This analysis applies to diffraction from the guide to the direction normal to the guide.

Figure 4:
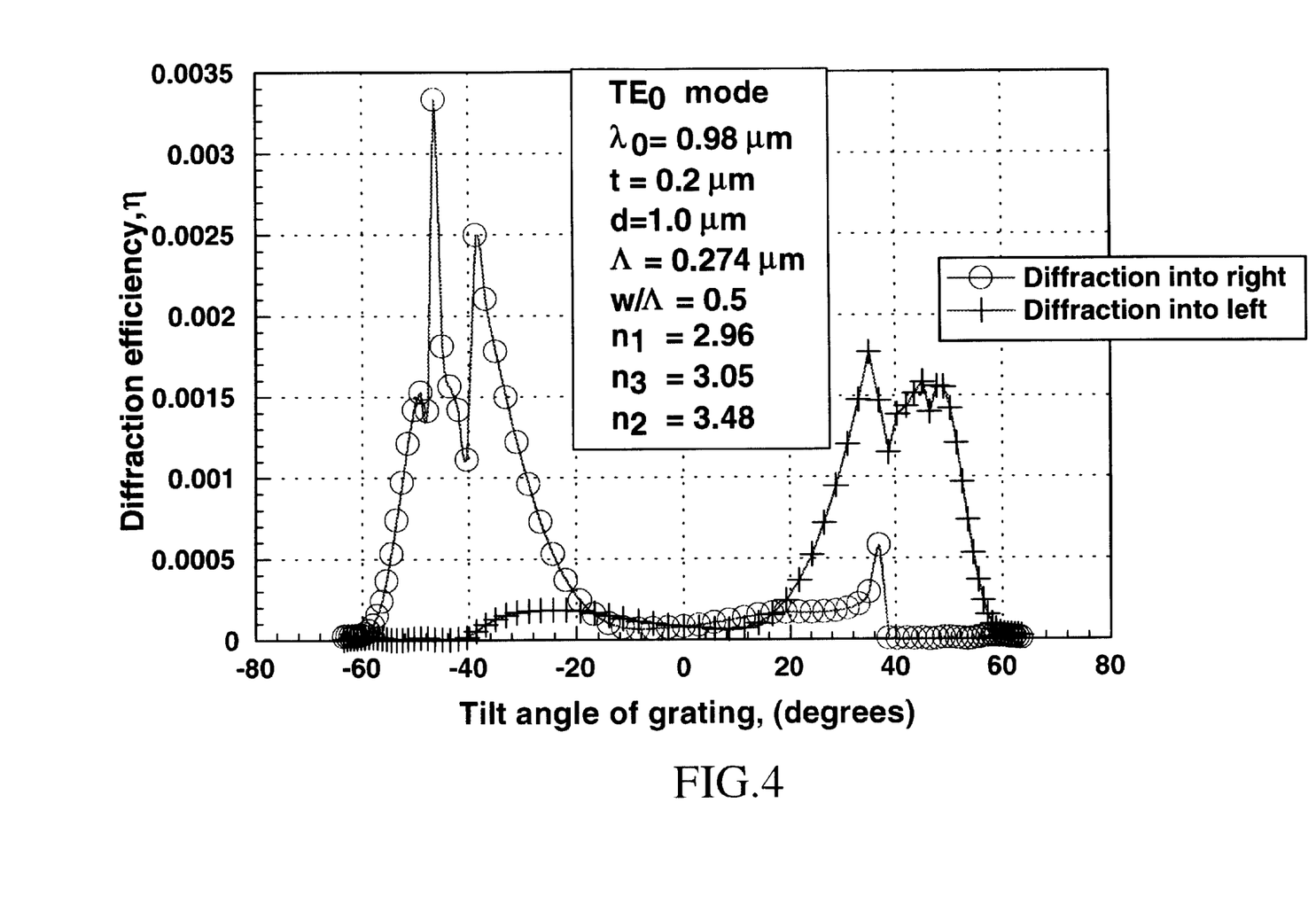
FIG. 4 shows the diffraction efficiency versus grating angle in the vertical cavity waveguide

All of the published work on waveguide diffraction has been for the process of diffraction of the guided wave into an unguided (leaky) wave propagating away from the guide. For the GC VCSEL the reverse process is required and the efficiency of the process is not necessarily the same in spite of the fact that optical propagation of energy through a passive structure should be reversible. This is because of the transmission of energy straight through the guide which is not present in the out-of-guide case. The same basic mathematical approach is applied to the three layer waveguide with a blazed grating. A typical result in FIG. 4 shows the diffraction efficiency out of the guide for a corrugated waveguide as the blaze angle is varied. It shows the optimum angle for typical index parameters ($n_1=n_3=3.4$ and $n_2=3.6$) is about 41° and the ratio of the diffraction in the two directions is about 135.

In the GCVSEL the waveguide cladding is formed by the bragg mirrors and thus the structure forms a multilayer waveguide with very complicated propagation coefficients. In order to apply the diffraction calculation, it is necessary to represent the VCSEL waveguide by an equivalent three layer guide and so it is necessary to represent the top (bottom) stack and its interface to air (substrate) by an infinite region with a single index. Since the material between the mirrors can be represented by a single index determined as the average over its layers, then the result will be a three layer waveguide. The wave propagating in a vertical cavity laser is characterized by a penetration depth. This is normally used to determine the effective cavity length of the VCSEL as $$L_{eff}=L_c+L_{pb}+L_{pt}$$

where $L_{pb}$ and $L_{pt}$ are the penetration depths of the bottom and top mirrors respectively which have been derived as $$L_{pt,b} = \frac{\tanh^2(|\kappa| \cdot L_{Mt,b})}{2|\kappa|}$$

where $L_{Mt,b}$ is the total front and back mirror thicknesses, and $\kappa$ is the coupling constant which is given by approximately $$\kappa \approx 2i\Delta n/\lambda$$

Here, $\Delta n$ is the index difference between the two layers in a pair of the mirror. In the standard description of the three layer waveguide, the TE mode is normally described by a function within the guide (asymmetric or symmetric) and by evanescent decay into the cladding on either side of the guide. The evanescent decay away from the guide, is determined by the refractive index in the region. To predict the behavior of the vertical cavity guide we assume that the penetration depth(s) of the vertical cavity mirror(s) correspond to the evanescent decay of a wave if it were propagating in the waveguide formed by the vertical cavity as the core of the guide, and the top and bottom mirrors as the claddings. Therefore, by using $L_{pt,b}$ we can determine the effective index of the top and bottom mirror regions from the point of view of a three layer waveguide. Using these indices we can then use the model developed for the waveguide diffraction into a three layer waveguide to determine the efficiency of the second order diffraction from the vertically propagating light to the guided wave.

In the preferred embodiment, the mirror pairs on the top are $SiO_2$ and GaAs corresponding to indices of 1.5 and 3.6. The bottom mirror is comprised of $Al_xO_y$ and GaAs corresponding to indices of 1.6 and 3.6. The typical design will be 7 pairs on the bottom and 4–7 pairs on the top. Using these parameters we determine $$L_{pt}=0.16 \, \mu m$$

and therefore an effective index above the core of $$n_{1eff}=2.96$$

Similar calculations for the lower mirror yield $n_{3eff}=3.05$. Then the diffraction efficiency is determined from the model by a three layer waveguide with indices of $n_1=2.96$, $n_2=3.48$ and $n_3=3.05$. The index of the core region ($n_2$), which is the vertical cavity itself, is determined by using a transmission matrix calculation for a slab waveguide. In FIG. 4. we plot the efficiency of the diffraction process for a parallelogramic grating in the VCSEL waveguide and the results show that we can expect an efficiency of $3.5\times 10^{-4}$ for a blaze angle of 45° and a grating etch depth of about 0.15 $\mu$m. The simulation shows a maximum efficiency at an angle of 45°. Such large blaze angles may be difficult to achieve with ion beam etching and also, for a depth of 0.15 $\mu$m the bottom of the parallelogram may penetrate back to undercut the top of the parallelogram which is not desirable. We thus choose an angle of about 35° which provides a value of diffraction efficiency of about 0.00178.

DETAILED DC OPERATION OF THE GCVCSEL

From the above description one can see that the light generated in the vertical cavity at z=0 will be diffracted to the right continuously. The diffracted light propagates in the form of a guided wave. The guided wave will itself be diffracted back into the cavity at each position z and will be amplified. The amplification will continue until the gain is saturated. From that point onwards, the saturated vertical cavity output will continue to add to the waveguide power resulting in a maximum waveguide output power at the device end, z=L.

Consider the photon density at any position z in the cavity of thickness dz where the laser is above threshold. We have $$F_{cav} = \frac{\tau_p'}{qL_x} \eta_e (J - J_{TH}) \qquad (1)$$

where $L_x$ is the quantum well width, $\eta_e$ is the electrical confinement factor, J and $J_{TH}$ are the current and current density and $\tau_p'$ is the effective photon lifetime for the vertical cavity device given by $$\tau_p'^{-1} = v_g \left[ \frac{1}{L} \ln\left(\frac{1}{R}\right) + \alpha_{vc} \right] \qquad (2)$$

where $\alpha_{vc}$ is the vertical cavity loss due to the diffraction grating. There will also be components of $\alpha_{vc}$ which are due to free carrier absorption and parasitic diffraction but these will be ignored for the moment to focus on the desired effect. In the final formula we may simply replace ln(1/R) by $L_{cav} * \alpha_{par}$ to determine its effect since in all likelihood this term will dominate ln(1/R).

The power output from the laser is comprised of two components which are written as $$P_{out} = h\nu W dz v_g t_f F_{cav} \qquad (3)$$

where $t_f$ is the power transmissivity of the output port. For the conventional transmission through the mirror (1) is substituted into (3) with $t_f = \ln(1/R)$ to give the power increment $$dP_{mir} = \frac{h\nu}{q} \frac{\eta_e}{1 + \frac{L_{cav} \alpha_{vc}}{\ln(1/R)}} (J - J_{TH}) W dz \qquad (4)$$

There is another power component which is the power diffracted into the guide. The transmissivity for this mechanism is the diffraction efficiency $t_f = \eta_{diff}$ so we have $$dP_{wg} = \frac{h\nu}{q} \frac{\Gamma}{L_x} \frac{\eta_{diff} \eta_e}{\frac{1}{L_{cav}} \ln(1/R) + \alpha_{vc}} (J - J_{TH}) W dz \qquad (5)$$

To determine $\alpha_{vc}$ we note that the primary optical loss in the vertical cavity by design will be the second order diffraction by the grating of the vertically propagating wave. In the development of diffraction into the guide using the above model from a normally propagating wave we have determined the diffraction efficiency $\eta_{diff}$ as $$\eta_{diff} = \alpha_g d_{eff} \frac{\eta_1}{\eta_2} A_y \frac{A_y^*}{C_o C_o^*} \qquad (6)$$

where $\eta_1$ and $\eta_2$ are the impedances of the guide and the incident medium (which in this case are the same), $A_y$ is the field intensity at the edge of the guide of the z propagating wave and $C_o$ is the field intensity of the incident wave. Thus we can say that the power diffracted into the guide from the incident wave is $\eta_{diff} C_o C_o^*$. However we can also regard the grating as a loss in the x direction for the wave $C_o$ and we can define a loss parameter $\alpha_x$ by the statement $$C_o C_o^* (1 - e^{-\alpha_x x}) = \eta_{diff} C_o C_o^* \qquad (7)$$

so that for a grating thickness of x=t we have $$\alpha_x = \eta_{diff}/t \qquad (8)$$

Since this loss occurs only over the grating thickness then we multiply by the confinement factor $\Gamma = t/L_{cav}$ to obtain an effective value for the total cavity of $$\alpha_{vc} = \eta_{diff}/L_{cav} \qquad (9)$$

for use in (5) and (2). Therefore the waveguide power is $$dP_{wg} = \frac{h\nu}{q} \frac{\eta_e}{1 + \frac{\ln(1/R)}{\eta_{diff}}} (J - J_{TH}) W dz \qquad (10)$$

Now the design of the laser should be such that $\alpha_{vc}$ is the dominant loss in the cavity and that negligible power escapes through the two mirrors which may be stated, by using (9) in (4), as $$\eta_{diff} >> \ln(1/R) \qquad (11)$$

From (5) it is seen that the power output is just the total output of the vertical cavity device with the efficiency of the diffraction as opposed to mirror transmission and is a linear function of the length of the laser. As the wave propagates in the guide, there is also diffraction of power into the guide. Basically this power diffracts from the wave into the cavity and then back into the guide with the same efficiency as the cavity flux. However, this photon flux can amplify the cavity flux through an adjustment of $F_{cav}$ and therefore of (10). In general, the amplification of waveguide power depends on the relative size of the mirror and diffractive loss. If the diffractive loss is very large, then the light realizes single pass gain, i.e. it passes through the cavity essentially once before it is diffracted back into the wave. This is equivalent to the linear optical amplifier with very low reflectivity in which case the majority of the light passes through the amplifier only once as a travelling wave. In these cases the amplifier always works below the threshold of the laser. If the diffractive losses are not too high, then the light may make many oscillations in the cavity before diffraction back into the guide and this situation is referred to as the multi-pass gain case. In this case, the laser is above threshold along most, if not all of the length of the laser. To obtain laser output, this is the situation we are interested in here. For this kind of operation (as we describe elsewhere) the threshold current of the laser is modified. We can therefore write an equation for the guide power which is $$\frac{dP_{wg}}{dz} = -\alpha_g \left(1 - \frac{1}{1 + \frac{\ln(1/R)}{\eta_{diff}}}\right) P_{wg} + \frac{h\nu}{q} \frac{\eta_e}{1 + \frac{\ln(1/R)}{\eta_{diff}}} \left(J - J_{TH}\left(\frac{\alpha_g F_g}{F_{cav}}\right)\right) W \qquad (12)$$

where in this case (6) is modified to $$F_{cav} = \frac{\tau'_p}{qL_z}\eta_e\left(J - J_{th}\left(\frac{\alpha F_q}{F_{cav}}\right)\right) \quad (13)$$

and the threshold current has now become a function of the flux injected into the cavity. The determination of the function $J_{th}(\alpha F_s/F_{cav})$ requires a modification of the photon rate equation from $$\frac{F_{cav}}{\tau_{st}} + \frac{F_{cav}T}{\tau_{st}} = \frac{F_{cav}}{\tau'_p} \text{ to } \frac{F_{cav}}{\tau_{st}} + \frac{F_{cav}T}{\tau_{st}} = \frac{F_{cav}}{\tau'_p} - \frac{\alpha F_g V_g}{L_{cav}} \quad (14)$$

The equation on the right is the conventional photon loss equation where the right hand side represents photon loss from the system. The equation on the right is the photon loss equation when an optical input is fed to the device. It is clear that the input photon term reduces the loss and therefore reduces the condition for threshold and therefore the threshold current. Specifically, the K parameter which is used to determine threshold, contains $\tau'_p$ and from (14), the photon lifetime is modified to $$\tau_{peff}^{'-1} = \tau_p^{'-1}(1 - \alpha_g F_g v_g \tau_p^{'-1}/F_{cav}L_{cav}) \quad (15)$$

i.e., the effective photon lifetime in the cavity increases with the input signal but decreases with the cavity flux itself.

Figure 5:
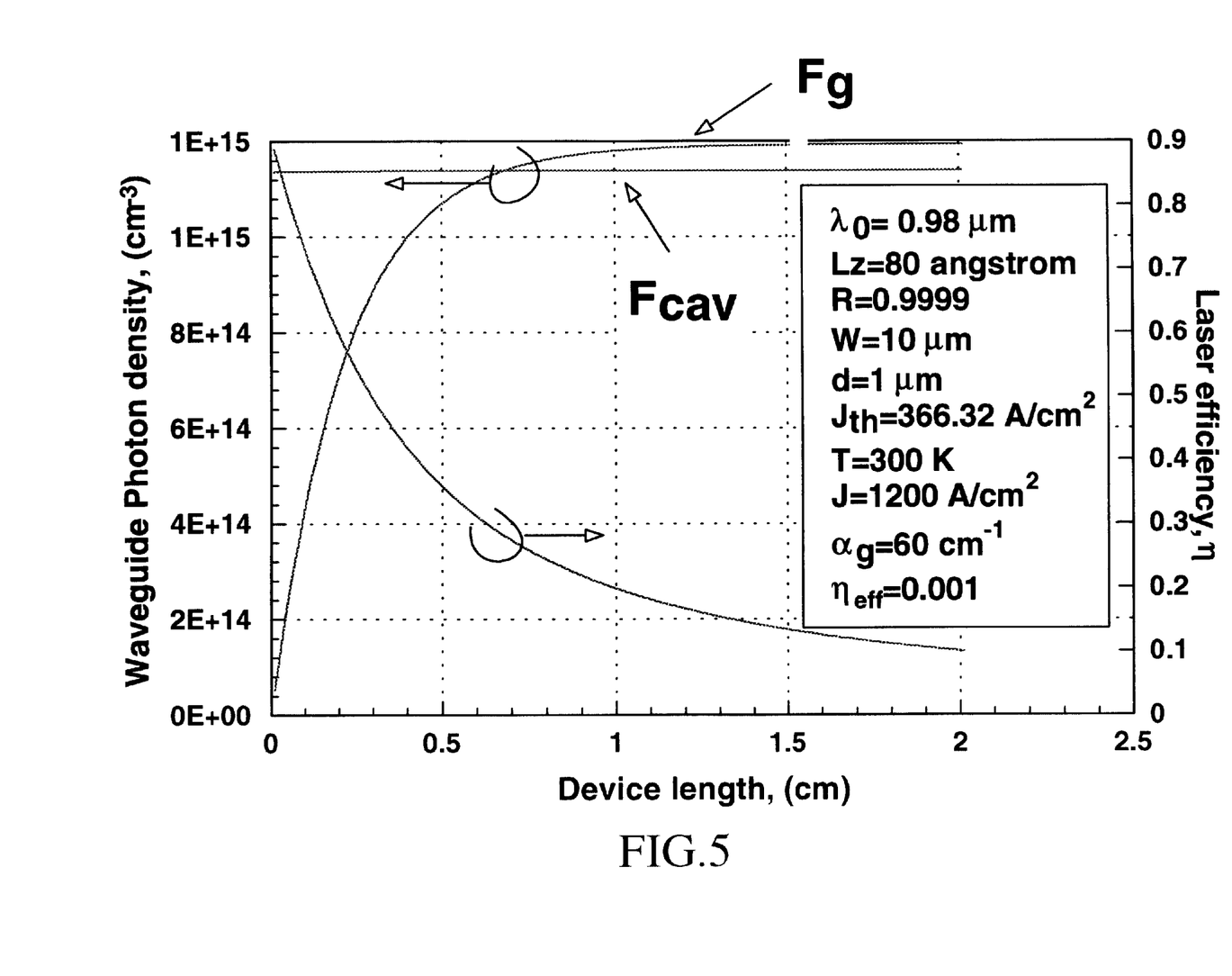
FIG. 5 shows the calculated waveguide photon density versus device length for the grating coupled traveling wave laser with the parameters as shown. $F_{cav}$ is the vertically propagating photon density and $F_g$ is the laterally propagating photon density.

The power output of the laser is determined by integration of (12) and is shown as a function of laser length L in FIG. 5. If the effect of optical gain in the cavity were absent so that $J_{TH}$ in (12) is a constant then the solution to (12) is $$P = \frac{h\nu}{q}\frac{W\eta_{diff}\eta_e}{\alpha_g\ln(1/R)}[J - J_{TH}]\left(1 - \exp\left(-\alpha_g\frac{\ln(1/R)}{\eta_{diff} + \ln(1/R)}z\right)\right) \quad (16)$$

which is equivalent to the output of a vertical cavity device with a width of W, a length of $L=1/\alpha_g$ and an efficiency of $\eta = \eta_{diff}\eta_e/\{\ln(1/R) + L_{cav}*\alpha_{par}\}$. Equivalently, we could say the efficiency was $\eta_e$ and the effective length was $\eta_{diff}/\alpha_g\{\ln(1/R) + L_{cav}*\alpha_{par}\}$. In the figure, the parameters are taken from a typical grating efficiency analysis and the parameters of $\eta_{diff}$=5e−4 and $\alpha_g$=50 are used with a cavity designed for R=0.9999. Then the effective length is 330 um. Alternatively we could regard the device as having an efficiency of 63% for a length of L=530 um. Desirable parameters are therefore $\eta=10^{-3}$ and $\alpha_g$=which can be achieved with the dielectric combination $SiO_2$/GaAs and a grating etch depth (thickness) of 1000Å. From our calculations for an asymmetrical grating the optimum blaze angle is about 30°. With these numbers, the laser output power for $J-J_{th}$=200 A/cm$^2$ and a waveguide width of 10 $\mu$m is about 0.25 W.

In FIG. 5 we also plot the efficiency of the laser as a function of z. The interesting feature here is the tradeoff between length and overall efficiency. For small z=L, the efficiency is close to 100%. As the length is increased the efficiency drops so that at $L\cong2\eta_{diff}/\ln(1/R)\alpha_g$ the efficiency has dropped to about 50%. This is clearly a design tradeoff in which the total power and efficiency must be traded off by the appropriate choice of length.

This device may also be operated as an optical amplifier. As long as $\eta_{diff}$ is large enough to prevent lasing, then it may still be quite small, i.e. it may be easily be around $10^{-3}$. The gain is obtained because for every increment of propagation distance in the z direction the wave traverses the vertical cavity Q times where Q is the quality factor. Since $Q=(v_o/v_F)\Im$ where $\Im$ is the finesse given by approximately $\Im=\pi/\alpha t=\pi/\eta_{diff}$ and $v_o$ and $v_F$ are the resonator frequency and free spectral range respectively then the light may traverse a distance of $QL_{cav}$ vertically in a propagation distance of dz in the guide. Estimating that 1−1/e of the wave is diffracted into the cavity in the distance $1/\alpha_g$ then the effective distance traveled by the wave is about $(v_o/v_F)\pi/\eta_{diff}L_{cav}\alpha_gL_{guide}$ during which it receives optical gain. Using typical numbers this is a distance of 15 cm. This indicates the feasibility of implementing an optical amplifier on a chip with monolithic integration which has all the benefits of the fiber amplifier. This points to the direction of implementing an integrated transmission system.

Figure 6:
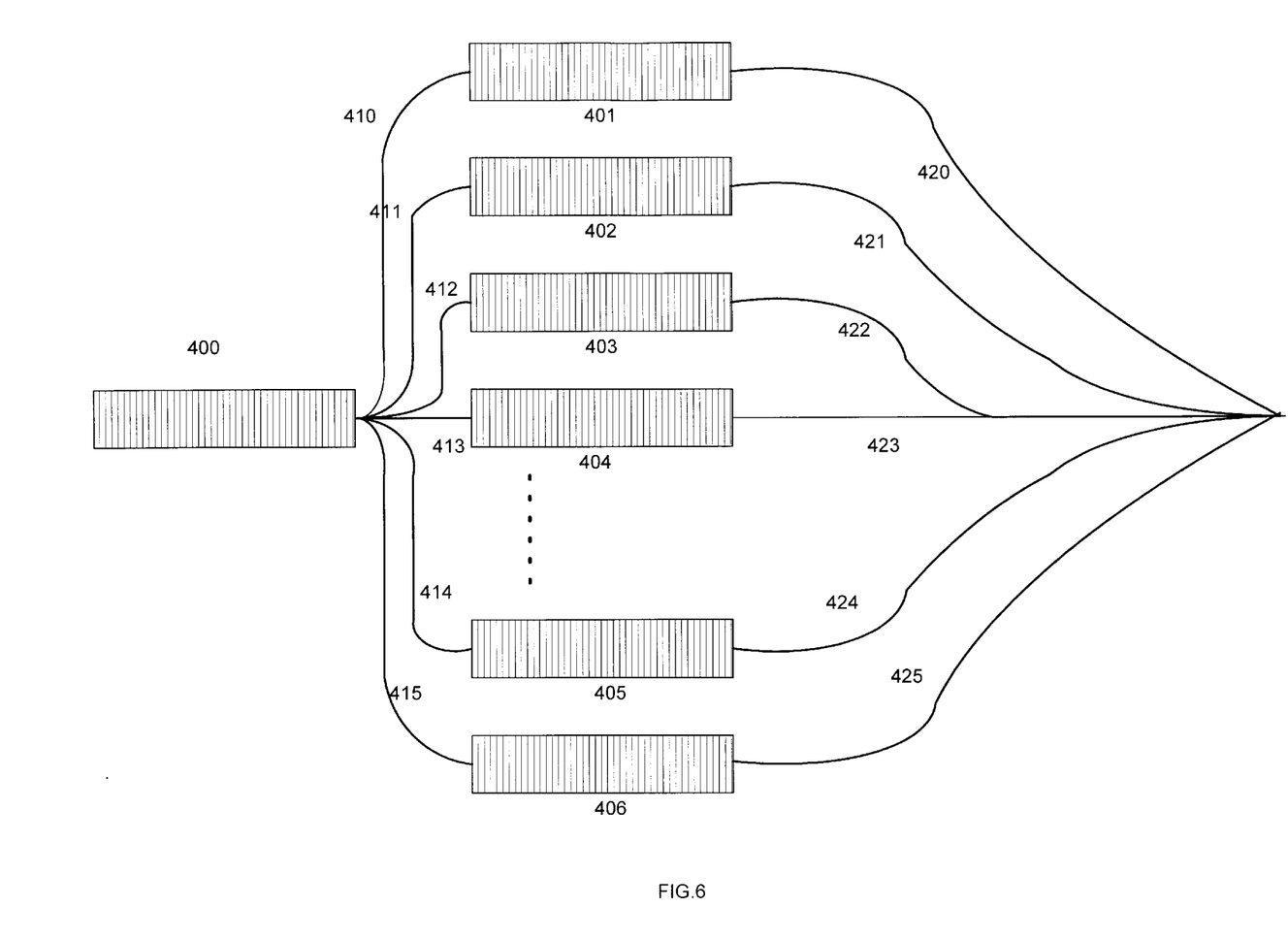
FIG. 6 is a schematic of a top view of an integrated circuit chip which uses a single GCVCSEL as a master laser and several GC amplifiers with on-chip waveguide connections to create a very large single spatial mode and coherent output power.

There is a particular benefit from using the device as an optical amplifier which is indicated in FIG. 6. The top view of an integrated circuit chip is shown in which several grating coupled amplifiers 401, 402, 403, 404, 405, 406 etc are shown connected by on-chip waveguides 410, 411, 412, 413 etc to a single GCVCSEL 410. The amplifiers have no identical phases if the optical path from the GCVCSEL is identical for each. This arrangement allows each amplifier to produce an amplified version of the GCVCSEL locked in frequency and phase. The outputs of the amplifiers are routed by on-chip waveguides 420, 421, 422, 423 to a single output port. The output waveguide may emit from a cross-sectional area and may combine the outputs of all amplifiers so that a very high level of spatially coherent light is delivered to a very small spot. This innovation provides a high power density and very high brightness source.

There are other benefits to be realized from this grating coupled arrangement which are 1) the polarization of the vertical cavity wave is forced to coincide with that of the waveguide. The locking of the polarization occurs because the waveguide mode is injected into the cavity at each point and creates some level of stimulated emission. The emission in the cavity reproduces the same polarization. The random nature of the polarization of the vertical cavity laser output is therefore eliminated. The output of the waveguide will be $TE_0$ normally because it is most easily excited in the guide (earlier simulations of Lee and Streifer have shown in general that the diffraction efficiency of the $TM_0$ mode is at least 10 times smaller than the $TE_0$ mode, so $TE_0$ becomes the principle supported mode). Because of the diffraction of the light from the guide into the cavity there will be a stabilizing effect and an extended range of single mode output power. For a conventional VCSEL, the output is single mode until a certain level of power is achieved and then multimode behavior is observed. In the grating coupled laser the onset of higher order VCSEL modes will require a much higher level of laser power to occur because of the stabilizing effect of the waveguide injected energy. In fact, the GCVCSEL will remain single mode until a higher order mode in the waveguide such as $TE_1$ or $TE_2$ matches to a higher order mode in the VCSEL.

2) The mode supression ratio will be characteristic of the vertical cavity laser. Because of the single mode nature of the VCSEL, the tendency for mode partition noise will be much reduced. The RIN noise should be typical of the VCSEL 3) One of the problems of edge emitting and vertical cavity lasers is the effect of back reflections into the laser when coupling to a fiber. In the grating coupled VCSEL, this problem is addressed in a unique way which may be understood from FIG. 1. Light is coupled from the laser to the waveguide and is transported to the chip edge. Reflections travel back to the laser and a standing wave will be set up which may be at a different frequency. Normally this energy will re-enter the cavity and may destabilize the laser. In the grating coupled laser, which we have modeled using an equivalent three layer waveguide, the asymmetry of the grating causes a dominant fraction of the power to be diffracted into the guide for light traveling towards the chip edge (direction of laser emission) and it also causes a dominant fraction of the light to be diffracted out of the waveguide for light approaching the laser from the edge of the chip. In essence then, the grating asymmetry acts to reject the light re-entering the laser with a ratio of diffraction up to diffraction down which is between 50 and 100:1. The grating thus acts as an optical isolator.

4) The GCVCSEL output is into a waveguide on the chip. The waveguide transports the light to the chip edge. Output coupling of the laser light to a fiber occurs from the waveguide to the fiber. One of the major problems in manufacturing involves attaching fiber to the chip and much effort has gone into the development of spot size transformers which are ways to match the waveguide mode size to the fiber aperture. The waveguide output is easily tapered in the lateral dimension to achieve this matching. In the vertical dimension the mode size can be enlarged considerably by the use of the ion implant to disorder the waveguide. As has been described elsewhere in the process flow for the inversion channel technology, the waveguide core is implanted with Si during the formation of the source and drain regions. This implant after RTA serves to disorder the bandgap of the quantum well layers which reduces the index. The net effect is to move the core index closer to the effective index of the upper and lower quantum well regions which causes the expansion of the mode into these regions. Judicious use of this implant and anneal step can be used to optimize the mode shape to increase the tolerances for the mode to fiber coupling problem.

Another way that the mode may also be expanded downwards into the lower DBR mirror is by adjusting the width of the guide and therefore the extent of the lateral oxidation. As the lateral oxidation can no longer extend totally underneath the guide, the confinement will be reduced and the mode will expand downwards into an unoxidized mirror structure.

Yet another way to widen the mode shape vertically is to remove layers of the upper DBR mirror from the waveguide as the chip edge is approached. In the device area there are many dielectric pairs to eliminate emission through the upper mirror. This maintains tight mode confinement. Along the waveguide these layers can be selectively removed to widen the mode shape.

HIGH SPEED OPERATION OF THE GCVSEL

A primary motivation for this design of laser is to achieve very high speed performance. Within the inversion channel technology the HFET laser is ideally suited to achieve very high bandwidths. The HFET laser is a laterally injected laser in which the gate/emitter and source injecting terminals lay next to each other along the surface and are therefore configured as adjacent electrodes as illustrated in FIG. 3. Also, in the vertical cavity arrangement as illustrated in FIG. 1 or 2, the distance from the quantum wells to the semiconductor surface can be ½ wavelength as in most VCSEL designs and since the source drain implant is performed from approximately 1000Å above the quantum well to achieve minimum channel access resistance, then the positive and negative electrodes form an almost perfect coplanar transmission line. The vertical cavity of the HFET laser structure is formed by the deposition of the dielectric stack over the electrode structure. These dielectric layers form the top dielectric cover for the coplanar line and are therefore important in determining $Z_o$. When implemented in this form the HFET laser implements almost perfectly a traveling wave laser. This traveling wave property extends the bandwidth of the laser to the limit imposed by the internal parasitic resistance and time constant because the coplanar electrical transmission line can be terminated on the chip by a transistor adjusted in impedance to match the $Z_o$ of the line. Then if the transmission line phase velocity and the waveguide group velocity are matched, one could introduce a signal on the coplanar line which would propagate at the same speed as the photon pulse which was being produced by the continuous injection of charge into the channel from the pulse propagating on the line. Suppose there was no dispersion of the electrical pulse and no dispersion of the optical pulse. If there was negligible delay in producing the photon (i.e. negligible transit time into the channel) and negligible delay in converting the electron to a photon (very fast laser internal response) then the laser would have an infinite bandwidth since then a delta function of charge introduced to the line would produce (after the transit time of the waveguide) a delta function of photons. The extent to which these conditions are not met determines the maximum laser speed and generally it is the internal parasitic RC constant which becomes the limiting factor (as we discuss for the detector this parasitic bandwidth is about 100 GHz).

Figure 7:
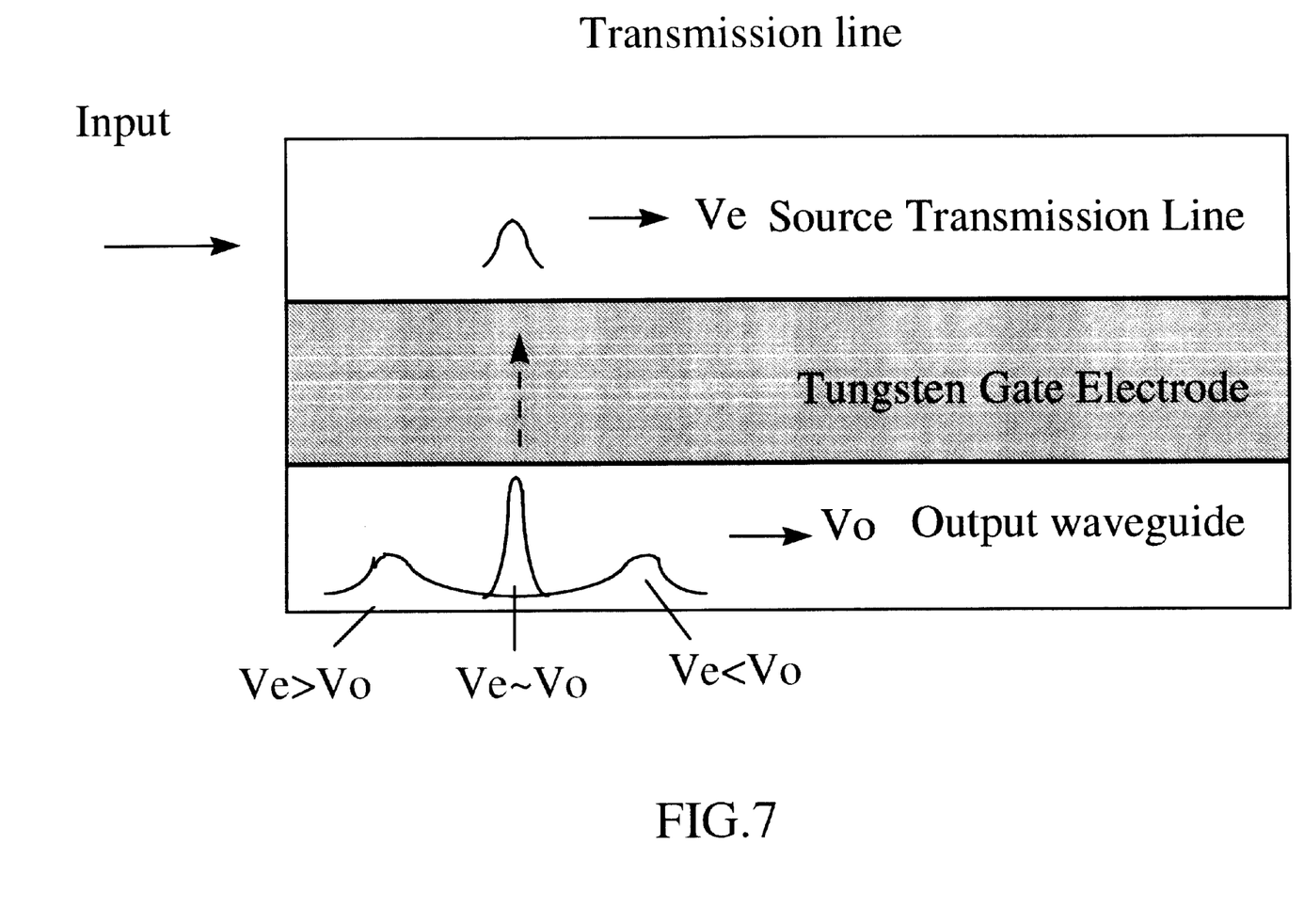
FIG. 7 shows the effect of velocity matching on the optical response of the laser

To determine further the dynamic operation consider a pulse introduced on to the coplanar line at x=0. Because of the almost identical structure of the optical waveguide and the transmission line in terms of the materials both above and below the semiconductor surface, the optical group velocity and the electrical phase velocity will be almost matched. As the pulse propagates on the line, it will continuously decrease in value as charge is injected laterally at each position x into the laser active section. Now the effect of the injected charge will be a maximum if the charge is injected at precisely the point of the maximum photon density. Also the charge impulse initially begins to create a photon impulse starting at x=0. Then if the photon pulse and the charge pulse move at the same velocity (i.e. the matched condition), it follows that as the charge impulse travels on the transmission line it will always be injecting its incremental charge into the laser at the position which corresponds to the maximum photon density in the waveguide. If this is the case, the photon pulse will grow the most efficiently because the number of photons produced by the injecting charge is proportional to the injected charge and the photon density, i.e. the product of the electron and photon densities. This behavior is illustrated schematically in FIG. 7 which shows the case at some position x along the waveguide the situations when the electrical pulse travels slower, faster and at exactly the same speed as the optical pulse. Ideally when they travel at the same speed, the photon pulse is a maximum height because the injected charge x photon density has been a maximum at every position and also the pulse width will be the narrowest because, assuming that the internal laser dynamics are sufficiently fast, the pulse width of the photons will be as narrow as the charge pulse. If there is negligible dispersion on the transmission line then the charge pulse and thus the photon pulse will retain its original delta function form, i.e. the photon pulse will remain essentially as fast as the input electrical pulse.

A complete analysis of the laser dynamic performance is exceedingly complicated if one attempts to illustrate the effects of the velocity matching or lack thereof. This is because of several properties unique to the lasing mechanism which are the photon response is proportional to the product of the injected carriers and the injected photons. Therefore in the laser cavity, at any position along the guide we need to consider a mixture of the dispersed pulse traveling on the transmission line and the dispersed pulse traveling in the waveguide and to represent their individual time dependencies.

in the laser there is an amplifier effect which means photons produce additional photons without the need for additional electrons. This may be considered an optical to optical effect as opposed to the electrical to optical effect of the carriers injected from the transmission line. Therefore we need to consider the dynamics of the optical amplifier effect in the waveguide itself so that the photon pulse is growing not only due to the injection from the line but also due to the internal optical gain. And as we mentioned earlier, this optical gain can be in one of two forms depending upon how far above or below threshold the laser is biassed. This situation is to be contrasted with the detector in which electrons are produced (i.e. the reverse process) only by the conversion of the pulse photons.

proper analysis requires use of the actual differential equations representing the electron and photon populations but represented in the form of traveling waves. These equations have not yet been solved self-consistently in the literature for the conventional diode laser without any travelling wave effects.

In spite of these complications it is clear that if the waveguide and transmission dispersions can be minimized and the internal parasitic RC constant can be reduced to 5–10 ps, then velocity matching of the HFET transmission line and the vertical cavity waveguide can enable speeds in excess of 100 GHz.

GRATING COUPLED TRAVELING WAVE DETECTORS

The identical structure performs the function of the traveling wave detector. Traditional detector geometries available to the designer include the classical vertically illuminated PIN structure or the waveguide structure which is edge illuminated. The inherent bandwidth-efficiency trade-off in the vertical device between absorption efficiency in the active layer and carrier transit time through it have been addressed significantly by the implementation of resonant cavity enhanced (RCE) structures wherein multiple optical passes are used to obtain almost total absorption in a very narrow active layer, i.e. in a quantum well. The drawback of the RCE is the narrow optical bandwidth which results from the high finesse of the cavity. Nevertheless, for many of the emerging practical system architectures in which wavelength division multiplexing is employed, the wavelength selectivity offered by the cavity is exactly what is required to perform optical to electronic demultiplexing. The difficulty of course is to devise a means to inject the light into the cavity since the high reflectivity of the cavity will reject the optical input unless it is exactly positioned within the narrow bandwidth corresponding to the position of the cavity optical mode.

In the waveguide configuration, it is typical to use a double heterostructure semiconductor structure with a quantum well active region. The thickness of the active layer can also be minimal since the absorption occurs along the length of the guide which can be designed for complete absorption. The transit time limitation and the RC limitation can be essentially the same as that of the vertically illuminated RCE device. The efficiency of the device does suffer, however, from the problem of poor input coupling since the numerical aperture of the typical semiconductor waveguide is small and the mode is not well matched to the typical mode of the optical fiber. These devices have been reported with 50 GHZ bandwidth and 40% external quantum efficiency and also 68% external quantum efficiency with >50 GHZ bandwidth.

Both of the above approaches behave as lumped element devices electrically and consequently, the reported bandwidths are approximately limited by the load resistance and the device capacitance. To alleviate the lumped element limitation and thereby improve bandwidth, traveling wave structures have been proposed. These devices basically combine the optical waveguide configuration with an electrical transmission line. This approach, which was introduced initially to enhance the speed of lithium niobate waveguide modulators has the potential to substantially reduce the effect of the RC time constants imposed by external circuits. The advantage is obtained because the load impedance presented to the detector does not combine with the internal impedance of the detector to establish a time constant if the load is matched to the characteristic impedance of the line. The temporal response is further improved if the transmission line energy velocity and the waveguide optical group velocity are matched, i.e the condition of zero velocity dispersion.

In practice, impedance matching and velocity matching are very difficult. Furthermore, the TWPD still suffers from the problem of poor input coupling since the basic semiconductor waveguide structure has remained unchanged. In fact the waveguide must be 1 μm or less in width to realize reasonable transmission line parameters and this exacerbates the coupling problem.

Another limitation with the existing traveling wave, waveguide or RCE designs is the problem of integration with electronic devices. A traveling wave device intended for 100 GHZ operation must feed photocurrent to an FET or bipolar front end in a matched configuration to avoid reflections. It is not practical or cost effective to do this with hybrid connections except for specialized applications and it thus becomes essential to have an integrated approach. Ideally, the integration should encompass the detector, the laser, and the electronic amplifier.

In the embodiment of the Inversion Channel Technology (ICT), the HFET resonant cavity enhanced detector is a novel means to address these problems since it combines the virtues of the vertical cavity RCE structure and the TW concept into a single device. This approach has several advantages which include 1) optimized mode matching to an optical fiber to achieve improved input coupling, 2) optimized impedance matching to reduce reflections, 3) optimized velocity matching to reduce pulse dispersion, and 4) integrated circuit compatibility to achieve a low cost high performance package.

Figure 8:
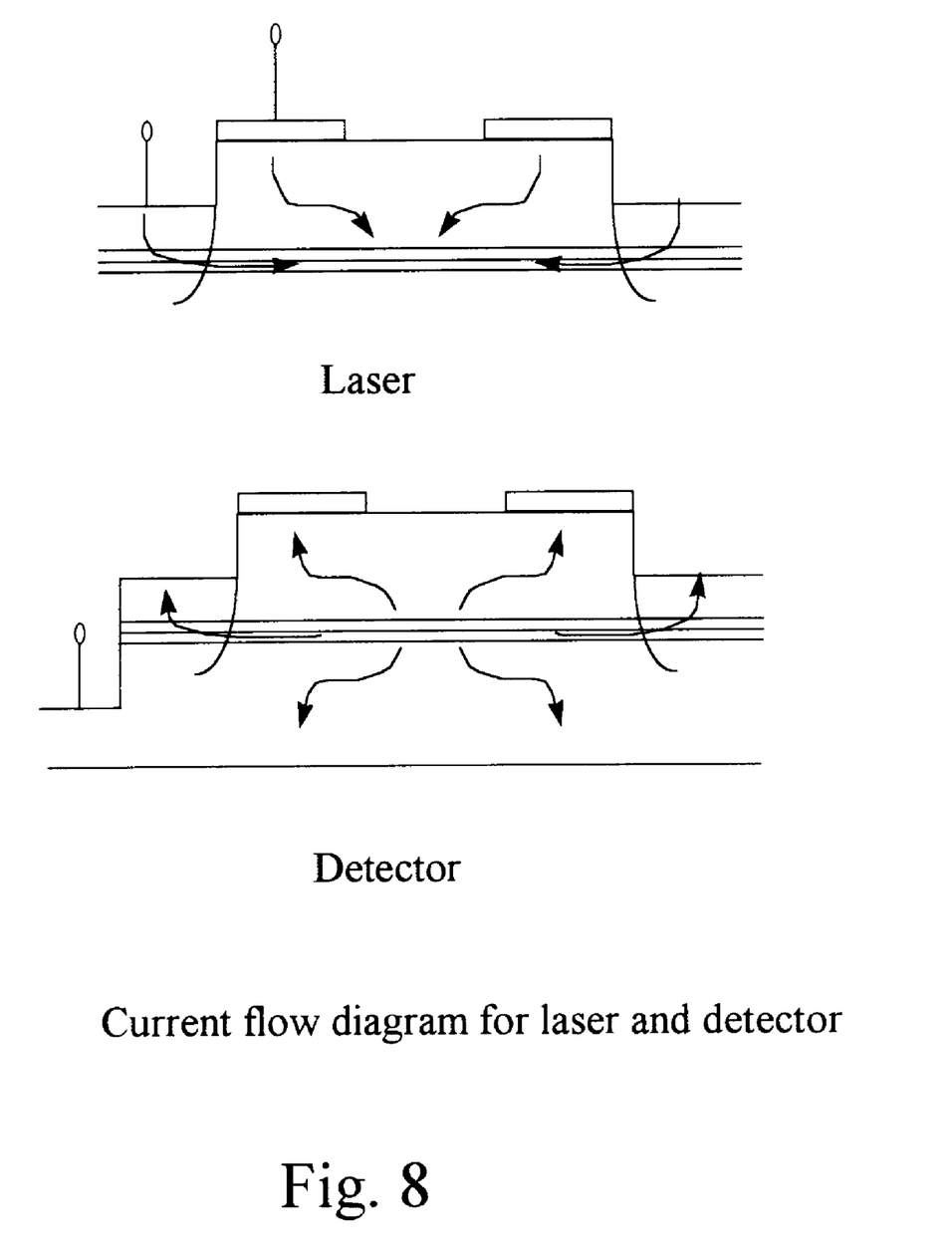
FIG. 8 shows and compares the different current flow patterns in the HFET detector and the HFET laser.
Figure 15:
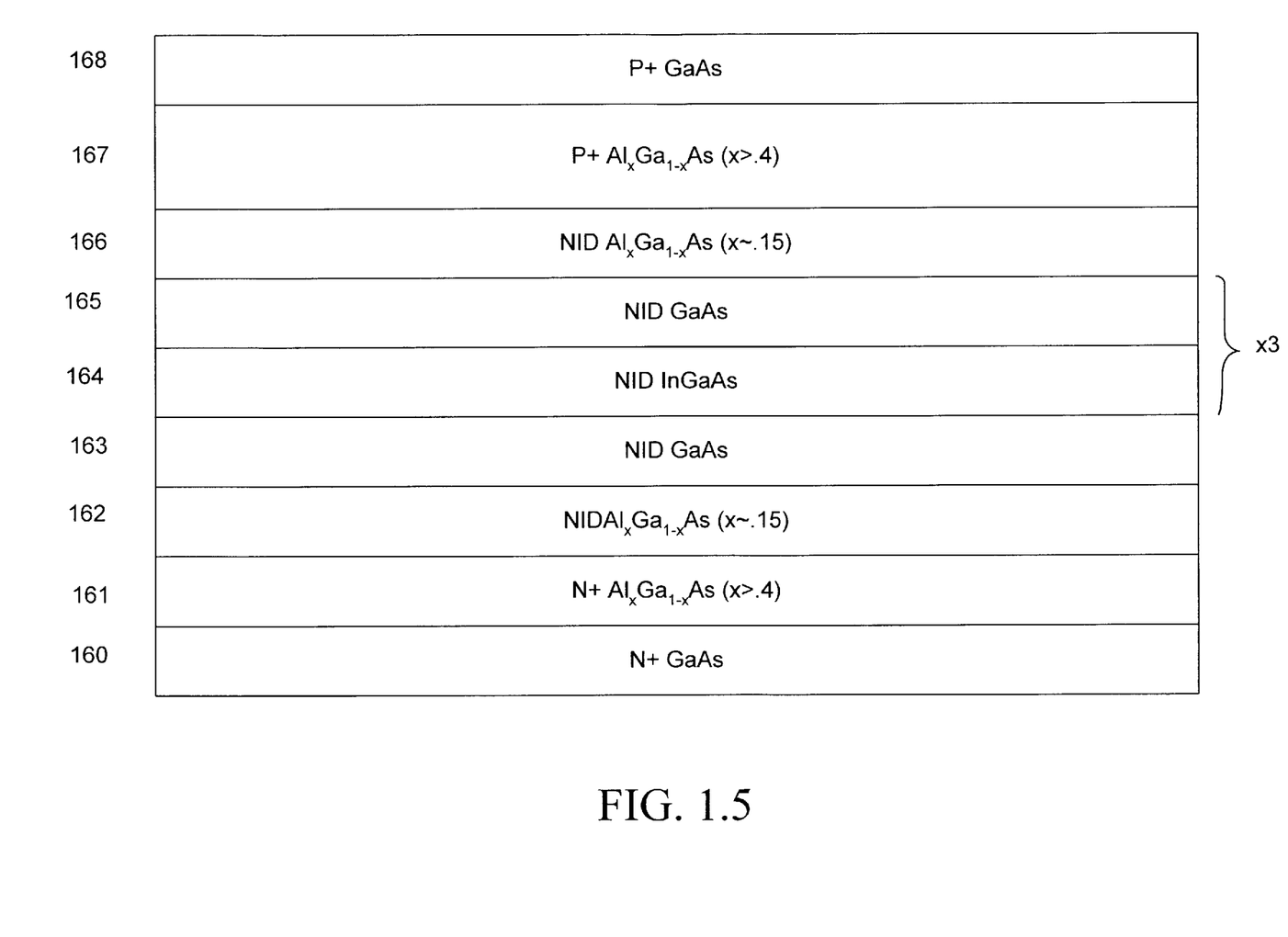

In the ICT the laser and detector are physically the same structure. Therefore FIGS. 1, 2 and 3 apply here. FIG. 3 show the traveling wave version of the HFET. To differentiate between the laser and the detector operation requires the device cross-section in FIG. 8 which shows the appropriate current flows. This figure indicates that the collection of carriers in the devices is lateral for the electrons and vertical for the holes. If the collector is contacted with a negative bias then the holes are removed downward to the collector. On the other hand if the gate is contacted with a negative bias, the hole current flows upward to the gate electrode. It is noted that the collector operation can be achieved with zero collector to source bias since the barrier at zero bias is low whereas the gate operation requires a bias to lower the channel to gate barrier for holes preferentially relative to the collector. The electrons flow within the inversion channel and are collected at the source nodes. The electrons flow to both source nodes so that the worst case transit time corresponds to ½ of the channel length and the average effective delay corresponds to a transit distance of L/4. Note that the vertical cavity geometry in FIG. 2 will typically admit light through an opening in the gate electrode so that the conduction of holes to the gate is by the 2D funneling mechanism which is typically used in the VCSEL structure to provide current injection into the same region as the optical emission. No conduction is required through the mirror structure however since the mirror is applied in the form of a dielectric stack at the end of the fabrication sequence. For the case of the waveguide configuration in FIG. 3, the potential across the gate is maintained by high doping and the wave is guided parallel to metal contact stripe and sufficiently separated from it to avoid excessive loss.

The description of the technology changes to accommodate the detector are essentially the same as those of the laser above. The metal contact is opened, as in the conventional vertical cavity device, to allow the passage of the light in the vertical direction. However here the light is propagating both horizontally and vertically. The dielectric mirror of the vertical cavity device is used here in a multi-functional role. First, the semiconductor growth between the quantum well active region and the dielectric stack is very thin, i.e. approximately $\lambda/2n$, where n is the average material index, in order to move the gate contact as close as possible to the inversion channel. This is necessary to form a high frequency transistor structure. However the optical mode is still efficiently guided because the dielectric stack provides efficient guiding of the mode. The mode is centered in the quantum wells but extends well above the gate metal contact. Second, the dielectric stack also forms a high finesse cavity in the vertical direction. Therefore the number of pairs in the stack and the index difference are selected to achieve the desired finesse for the resonant cavity. Third, the multiple layer structure of the cavity mirror allows a large optical mode to be supported for propagation in the horizontal direction. The enlarged mode size increases the mode near-field pattern and decreases the far-field angles which facilitates easier coupling to a fiber. The input light is edge coupled to a waveguide at the chip edge with a cross-section designed for optimum coupling. The waveguide guides the light to the detector where it propagates along the device waveguide as shown in FIG. 3.

As for the laser the key element to enable the combined waveguide, vertical cavity operation is a grating which is created in the first layer of the dielectric stack. This is a second order grating which diffracts a portion of the input wave into the vertical cavity at each position along the guide. Since the light propagating vertically in the cavity is absorbed essentially completely due to the resonant enhancement effect then the limitation on the detector efficiency, i.e. the length of detector required, is determined by the grating parameter $\alpha_g$. Because the grating index change can be made fairly large by suitable design of the dielectric stack then $\alpha_g$ can be large and the waveguide length can be optimized for high speed operation.

One of the obvious features of this design is that since the light is transferred to the resonant enhanced structure via the grating which passes below the dielectric stack then the problem of injecting light into the cavity through a dielectric mirror with a very narrow modal bandwidth has been eliminated. Clearly, the light will not be absorbed if its frequency does not align with that of the mode. However, this is a desirable property, since it allows the cavity to select any particular frequency as would be required in a WDM application, i.e. the light is always coupled into the cavity with the cavity mode providing the filtering or demultiplexing operation. Those frequencies which are not selected are simply coupled back into the waveguide by the grating and are propagated out of the device.

The HFET TW detector illustrated in FIG. 3 uses the gate contact to collect the hole current in order that it may form the signal line for the transmission line. The other side of the line, i.e. the ground line, is formed by the metal electrodes on the source junctions. Due to the aspect ratio as indicated in FIG. 3, which shows the two metal electrodes at approximately the same elevation, (within 1500–2000Å), the source and gate electrodes behave as a coplanar transmission line. Therefore, as photo-charge is injected into the source and gate electrodes, these perturbations form a traveling wave on the coplanar line which propagates to the far end of the device(x=L in FIG. 1). If the group velocity of the transmission line wave and the group velocity of the optical wave are matched then the photo-charge is added synchronously to the electrical wave and there will be no distortion of the pulse due to velocity mismatch. If the transit time of holes to the gate from the channel and of electrons to the source contact from the channel are equal and if there is no dispersion on the transmission line or the waveguide then the input pulse shape will be preserved. Finally if the transmission line is exactly matched in its characteristic impedance, there will be no reflection and the pulse will be perfectly replicated, i.e. the impulse response of the detector would be infinite. These conditions can never be realized perfectly and it is the deviation of these criteria from the ideal which determines the actual detector bandwidth.

The virtue of the traveling wave concept is that the impedance of the circuit following the detector does not combine with the detector impedance to produce delay if ideal line matching is achieved. However parasitic RC delays which are intrinsic to the device are still an issue. These are the time constant associated with transferring the electron and hole from the absorption region to the source metal and gate metal respectively. To minimize these parasitic effects, the transmission line metal to metal spacing should be reduced and the channel doping increased as much as possible by aggressive technology scaling. The other fundamental delay is the transit time of electrons in the absorbing FET channel. For a channel length of L=1 $\mu$m, this time corresponds to an average of $L/4v_s$ For a $v_s \approx 2*10^7$ cm/sec at low fields, this corresponds to a delay of about 0.15 ps. From the point of view of efficiency, the attenuation of the transmission line $\alpha_e$ must now be added to the losses in the resonant cavity enhanced detection process. This attenuation increases with frequency with dependencies on the source and gate metal skin effect depths and the frequency dependent propagation constant. In this respect, the bandwidth limitation of the lumped element configuration has been exchanged for a conversion efficiency limitation resulting from the attenuation or loss of the traveling photo-induced current.

What is claimed is:

1. A resonant vertical cavity optoelectronic semiconductor device, comprising
   an epitaxially grown distributed bragg reflector bottom mirror;
   a first layer of N+ type GaAs deposited on said epitaxial mirror;

a layer of N+ type aluminum gallium arsenide disposed on said layer of GaAs;

a layer of P type aluminum gallium arsenide disposed on said layer of N+ type aluminum gallium arsenide;

a PHEMT (Pseudomorphic High Electron Mobility Transistor) epitaxial layer structure without a schottky contact and using N+ type modulation doping, disposed on said layer of P type aluminum gallium arsenide said PHEMT comprising a layer of aluminum gallium arsenide (~15% Al), a layer of GaAs, one to three quantum wells of strained InGaAs separated by GaAs barriers, a spacer layer of aluminum gallium arsenide (~15% Al), an N+ modulation doped layer of aluminum gallium arsenide (~15% Al) and a gate spacer layer of aluminum gallium arsenide (~15% Al);

a very thin (~80Å) layer of P+ type heavily doped aluminum gallium arsenide (~15% Al) as a planar doped layer and then a cladding layer of aluminum gallium arsenide (40%–70%) of modest P type doping ($\sim 10^{17}$ cm$^{-3}$) disposed on said planar doped layer;

an ohmic contact layer of P++ type doping deposited on said cladding layer;

a first layer of a top dielectric mirror deposited on said contact layer to a thickness of approximately ¼ wavelength of a specific designed frequency and etched to a controlled thickness to form an optical grating with a second order pitch for diffraction through approximately 90°, the angle of the teeth of said diffraction grating being chosen to optimize the diffraction in a specific desired output direction and to minimize the diffraction in the opposite direction and the depth of the teeth being chosen to maximize the diffraction efficiency;

additional layers of said top dielectric mirror deposited on said first layer of said top dielectric mirror to form a complete structure of said Distributed Bragg Reflector (DBR) mirror with very high reflectivity for a vertically resonant wave such that the diffracted energy of the grating is substantially greater than the energy transmitted through the mirror.

2. The device as defined in claim 1, fabricated in the form of a waveguide device with DBR mirrors performing the function of waveguide cladding regions wherein the optical energy in the guide is diffracted into a vertical cavity or is obtained by diffraction from the vertical cavity, utilizing two refractory metal emitter electrodes positioned on either side of said waveguide device the positive species current from said refractory emitter electrodes being steered into or out of the core of said device waveguide by N type implants positioned beneath said electrodes to reduce optical mode interaction with said electrodes, and utilizing ion implants self-aligned to said emitter electrodes to form source or drain electrodes which make electrical contact with a quantum well channel region thereby providing a source or a drain for negative species current flow, with each emitter and self-aligned source or drain electrode forming a coplanar transmission line.

3. The device as defined in claim 2 wherein the structure of said device between said epitaxially grown bottom DBR mirror and said deposited top DBR mirror is a conventional pn semiconductor laser with either a separate confined heterostructure (SCH) or a graded index confinement scheme.

4. The device as defined in claim 2, wherein said emitter electrodes are biased positively with respect to said source electrodes such that stimulated emission establishes a vertically resonant optical mode which is diffracted substantially into one direction to obtain an edge emitting laser.

5. The device as defined in claim 2, wherein a high speed electrical signal is introduced onto the transmission line to obtain a high speed traveling optical pulse in said optical waveguide such that a traveling wave laser is obtained.

6. The device as defined in claim 2, wherein said waveguide in said optoelectronic device is coupled to another passive waveguide within a monolithic integrated circuit, the core of said passive waveguide being identical to the core of said waveguide within said optoelectronic device except for the p+ contact layer and shifted in energy gap with respect to said active core by disordering techniques such that the passive waveguide has low optical loss but the interface between said active waveguide and said passive waveguide has a small index change and therefore low insertion loss.

7. The device as defined in claim 2, wherein the source electrodes are biased positively with respect to the emitter electrodes such that separation of photoelectrons and photoholes produced in the quantum well(s) by resonant cavity absorption is achieved and a traveling electrical wave is produced on the transmission line resulting in a high speed traveling wave detector.

8. The device as defined in claim 2, wherein it is biased as a laser above threshold, the optical output of said laser being delivered to a passive waveguide which is split into several outputs, said outputs becoming the respective optical inputs to a second set of lasers, each laser in said second set of lasers being biassed below its threshold level such that it amplifies its optical input and the outputs from all said amplifiers entering into passive waveguides, said passive waveguides being combined into one single waveguide, and said single waveguide delivering its power to the edge of the semiconductor chip to obtain a spatially coherent optical output with single mode power of high intensity and high brightness due to the small waveguide cross-section.

* * * * *